United States Patent [19]

Faris

[11] Patent Number: 4,777,362

[45] Date of Patent: Oct. 11, 1988

[54] PARTICLE TRIGGER AND DELAY GENERATION SYSTEM

[75] Inventor: Sadeg M. Faris, Yorktown Heights, N.Y.

[73] Assignee: Hypres, Inc., Elmsford, N.Y.

[21] Appl. No.: 870,713

[22] Filed: Jun. 4, 1986

[51] Int. Cl.⁴ .............................................. G21K 5/00
[52] U.S. Cl. .................................. 250/251; 250/307; 250/308
[58] Field of Search ............... 250/308, 251, 306, 307, 250/310, 492.1, 492.2, 492.3, 398, 336.1 R, 336.1 SU; 324/71.3, 71.4, 71.5, 71.6, 96

[56] References Cited

U.S. PATENT DOCUMENTS

| | | | |
|---|---|---|---|
| 3,450,879 | 6/1969 | Seppi | 250/336.1 |
| 3,691,381 | 9/1972 | Kleppner | 250/336.2 |
| 3,949,210 | 4/1976 | Eichinger | 250/336.1 |
| 4,401,900 | 8/1983 | Faris | 307/352 |

OTHER PUBLICATIONS

G. A. Mouru, et al. (ed), "Picosecond Electronics and Optoelectronics", Springer-Verlag (Berlin), 1985, pp. 236–243.

*Primary Examiner*—Bruce C. Anderson
*Assistant Examiner*—Paul A. Guss
*Attorney, Agent, or Firm*—Kenyon & Kenyon

[57] ABSTRACT

A device to measure the extremely fast electrical waveform generated when atomic or subatomic particles of an identical type strike an electronic circuit or device. The device comprises a trigger element which signals the incidence of a particle on the electronic device and a picosecond sampler which receives the trigger signal and the waveform generated by the electronic device. The sampler obtains a measurement of a discrete point on the generated waveform each time a particle passes through the trigger element to the electronic device. The sampling point on the waveform can be moved by various techniques so that the entire waveform may be measured by the sampler.

19 Claims, 1 Drawing Sheet

4,777,362

PARTICLE TRIGGER AND DELAY GENERATION SYSTEM

TECHNICAL FIELD

The invention relates generally to devices which characterize the effect of particle bombardment on electronic circuits or devices. In particular, the invention relates to devices for measuring extremely fast electrical waveforms produced when an atomic or subatomic particle strikes an electronic circuit or device.

BACKGROUND OF THE INVENTION

Atomic and subatomic particles, such as alpha particles, are constantly streaming through the universe and striking objects at random intervals. While more frequent in outer space, many of these particles exist in earth's atmosphere as well. When such a particle strikes a sensitive electronic circuit, it can generate unwanted electron-hole pairs which can upset the operation and output of the circuit. Either or both of two techniques can be used to accommodate these particles. First, the circuit can be shielded. This is not entirely satisfactory since a shield will stop only those particles having less than a certain energy level. Second, the circuit can be designed so as to compensate for the particular electrical waveform which a particle causes. This technique has not been completely satisfactory because the waveforms, which typically have rise times on the order of 5 picoseconds, are too fast to measure with today's technology.

However, there have been recent advances in devices which can sample picosecond waveforms. These devices have almost exclusively used Josephson junctions to perform the sampling and have time resolutions that today approach 2 picoseconds. So far, Josephson samplers have mostly been used to investigate electrical waveforms of circuits on the same chip and in the same cryogenic environment as the samplers. Apparatus and techniques to allow connection of a Josephson sampler to an external environment without degrading the resolution of the sampling are now being made available as sampling applications have increased.

With the advent of picosecond samplers, a controlled test environment can be established to methodically inject atomic or subatomic particles onto an electronic circuit or device. The resultant electrical waveforms produced by the bombarded electronic device can then be measured with high resolution and the electronic device can thus be re-designed for compensation. Control of the characteristics of the injected particles, such as, particle type, velocity, and angle of incidence, allows an electronic circuit or device to be tested and designed for a particular application whether in space or on earth.

SUMMARY OF THE INVENTION

The foregoing problem is obviated by the present invention which comprises: Apparatus for measuring the electrical waveform generated by an atomic or subatomic particle incident on an electronic device, comprising:

means for detecting the incidence of the particle on the device a first time interval before the particle strikes the device;

means for sampling a point on the said waveform at a second time interval following detection of the incidence of the particle by the means for detecting; and means for moving the sampling point timewise along the said waveform during succeeding particle incidences so that the means for sampling measures the entirety of the said waveform.

The means for detecting is chosen to have as small an effect as possible on the path and energy of the particle, so that the particle will strike the device under test in substantially the same manner as it would in actual operation. Alternatively, the means for detecting should have a predictable effect on the path and energy of the particle so that such effect can be countered later on. After the electrical waveform is sampled at one point, the invention continues to detect succeeding particle strikes which, under controlled conditions, produce the same electrical waveform. Thus, the invention can sample different points of the waveform until the entire waveform is measured. It is advantageous to average several samples at each point in order to reduce the effects of noise and the like.

BRIEF DESCRIPTION OF THE DRAWINGS

For a better understanding of the invention, reference is made to the following description of exemplary embodiments thereof, and to the accompanying drawings, in which.

DETAILED DESCRIPTION

Figure 1:
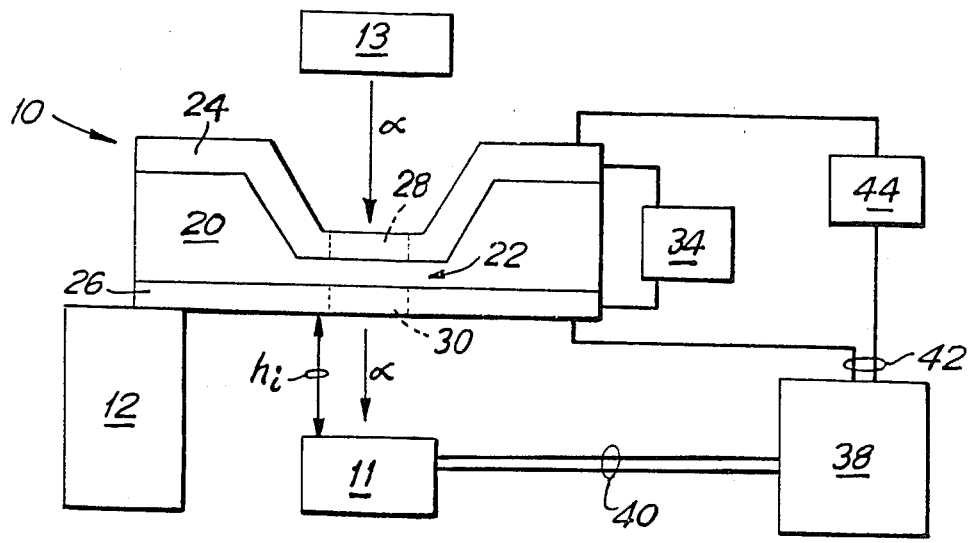
FIG. 1 is a schematic representation of an apparatus constructed according to the present invention.

As shown in FIG. 1, the apparatus comprises a trigger generator 10 held at a predetermined but variable height $h_t$ above a Device Under Test (DUT) 11 by height varying means 12. An example of such height varying means 12 is a motorized lead screw having a support platform for the trigger generator 10. The DUT 11 will be considered to be an electronic circuit but the invention will work on any device that is affected by the bombardment of atomic or subatomic particles. A particle source 13, which can be a particle accelerator, such as a cyclotron, betatron or the like, is located above the apparatus and injects an alpha particle to the DUT 11 through the trigger generator 10. The particle is shown as an alpha particle but the apparatus will operate for other particles as well.

The trigger generator 10 comprises an insulating layer 20 shaped so as to have a very thin region 22 through which the alpha particle can pass relatively unaffected. If the insulating layer 20 is made of silicon, for example, the thin region 22 should be on the order of one micron thick. The thin region 22 can have a wide range of thicknesses, however, depending on the energy of the particle which in injected through the trigger generator 10. The top and bottom surfaces of the insulating layer 20 are each coated with a conductive layer 24, 26 which may be aluminum. The top and bottom conductive layers 24, 26 have windows 28, 30 etched therein, respectively above and below the thin region 22. The windows 28, 30 are lined up so that the alpha particle can pass through the top window 28, the thin region 22 of the insulating layer 20, and the bottom window 30. A biasing circuit 34 is connected across the top and bottom conductive layers 24, 26 to establish a voltage across the trigger generator 10.

The DUT 11 is mounted directly below the windows 28, 30. Although the DUT 11 is referred to herein as being "below" the trigger generator 10, it will be understood that any orientation of the apparatus and the DUT 11 is possible to accomodate the configuration and/or direction of the particle source 13. A high resolution Josephson sampler 38, such as that described in U.S. Pat. No. 4,401,900 to Faris, is provided for measuring the electrical waveform generated by the alpha particles striking the DUT 11. The signal input terminals of the sampler 38 are connected via high performance transmission lines 40 to the desired locations on the DUT 11 and the trigger input terminals are connected via high performance transmission lines 42 across the two conductive layers 24, 26 on the trigger generator 10. The high performance transmission lines 40, 42 are part of the apparatus for electrically interfacing the parts of the Josephson sampler 38 which operate at low temperatures with the trigger generator 10 and the DUT 11 normally operating at room temperature. Examples of such interface apparatus are described in the co-pending patent applications Ser. No. 796,841 entitled "Room Temperature to Cryogenic Electrical Interface" filed on Nov. 12, 1985 and Ser. No. 796,842 entitled "Open Cycle Cooling of Electrical Circuits" filed on Nov. 12, 1985. Note that such interface apparatus, including the transmission lines 40, 42, have very low loss characteristics which do not degrade the sampling resolution of the sampler 38. FIG. 1 also shows a time delay 44 interposed between the trigger generator 10 and the sampler 38, which delay may already be inherent in the transmission lines 42 and the trigger input circuitry of the sampler 38.

In operation, the height varying means 12 is activated to place the trigger generator 10 at a predetermined height $h_1$ above the DUT 11. During the first test cycle, the particle source 13 injects an alpha particle through the top window 28 which then enters the thin region 22 of the insulating layer 20. Electron-hole pairs are formed in the insulating layer 20, temporarily creating a conductive path between the two conductive layers 24, 26. The conductive path causes a brief voltage dip in the voltage appearing across the trigger generator 10 which, after a delay period, triggers the sampler 38. After passing through the thin region 22, the alpha particle continues through the bottom window 30, traverses the distance $h_1$ and strikes the DUT 11.

Figure 2:
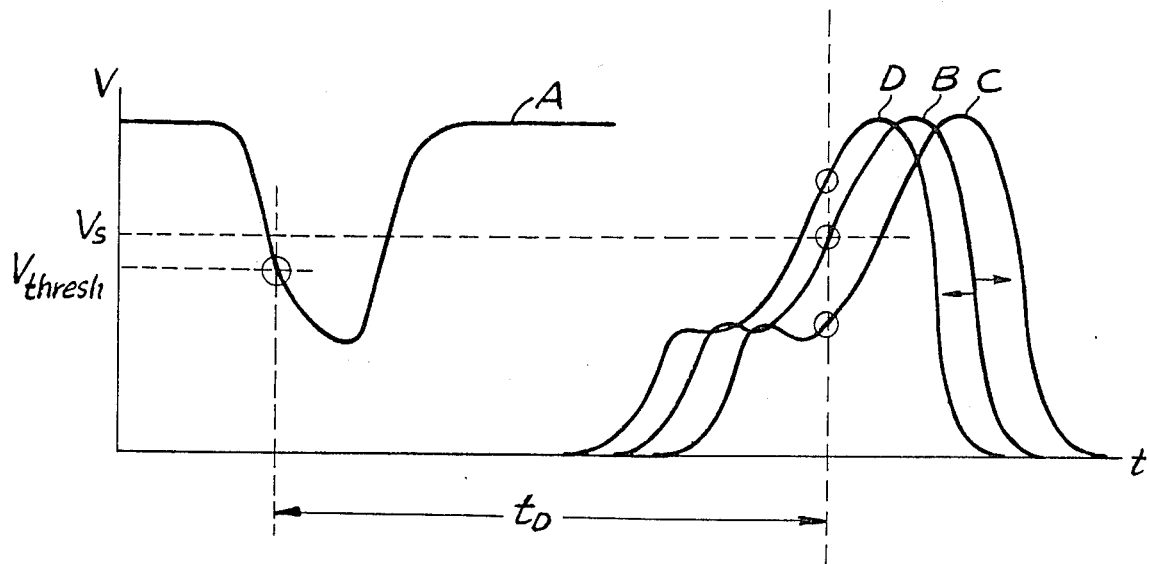
FIG. 2 shows sample voltage waveforms produced when an atomic or subatomic particle passes through the apparatus of FIG. 1 to a Device Under Test (DUT)

FIG. 2 shows a typical electrical waveform which may be generated when the alpha particle strikes the DUT 11 and shows how the apparatus of FIG. 1 can be used to measure it. Curve A shows the voltage waveform across the trigger generator 10. The voltage dip represents the effect of the alpha particle passing through the thin region 22. After the particle exits the trigger generator 10, it traverses the distance $h_1$ at a predetermined velocity until it strikes the DUT 11 and causes the voltage waveform of curve B. The trigger waveform, i.e., curve A, is delayed in its effectiveness by the time delay 44 so that at a time interval $t_D$ following the drop of the trigger generator 10 voltage below a predetermined threshold voltage $v_{thresh}$, the sampler 38 will sample the DUT waveform, i.e., curve B. A voltage sample $v_s(t_1)$ will thereby be obtained. The particle source 13 injects succeeding alpha particles with the same characteristics onto the DUT 11 which produces the same DUT waveform for each particle incidence. A collection of voltage samples $v_s(t_1)$ can then be taken in the above-described manner at the same point $t_1$ on the recurring DUT waveform until an average value is obtained. Note that if a source of noise can be sufficiently identified beforehand, the voltage samples can then be weighted properly to yield a magnitude of the average value closer to the true value.

The resolution of the sampling relies upon the fact that the alpha particle strikes a trigger generator 10 thin enough to allow the same particle to also strike the DUT 11. Therefore, the trigger waveform and the DUT waveform are synchronized with minimum jitter and the sampling delay remains substantially the same for each voltage sample $v_s(t)$ taken. Any variance in the sampling delay should then only be caused by vibration, electrical noise and the like. Known isolation methods can be employed to reduce the effect of these external factors in degrading the sampling resolution.

Next, the height varying means 12 is activated to move the trigger detector 10 to a different height $h_2$ above the DUT 11, and another collection of voltage samples $v_s(t_2)$ are taken. If the new height $h_2$ is higher than the previous height $h_1$, the injected alpha particles will take longer to reach the DUT 11 and thereby delay the generation of the DUT waveform by a period dependent upon the change in height $h_2-h_1$. With the time interval $t_D$ unchanged by the time delay 44, the apparatus will effectively be sampling an earlier point on the DUT waveform. This is shown by curve C in FIG. 2. Alternatively, if the new height $h_2$ is lower than the previous height $h_1$, then the apparatus will effectively be sampling a later point on the DUT waveform. This is shown by curve D in FIG. 2. Collections of samples are taken with the trigger detector 10 at different heights $h_i$ until enough discrete points, i.e., voltage samples $v_s(t)$, are obtained to map out, to a desired level of continuity, the DUT waveform expected to be generated by the incidence of an average alpha particle on the DUT 11.

Varying the height or distance between the trigger generator 10 and the DUT 11 is only one of several techniques of shifting the sampling point on the DUT waveform. An alternative would be to maintain the height $h_i$ constant and variably change the time interval $t_D$ for each voltage sample $v_s(t)$. Instead of altering the time of generation of the DUT waveform, this directly changes the time period between the trigger waveform and the DUT waveform. If the trigger generator 10 is a threshold switchable device, such as a bistable device, a variable sampling delay could also be obtained by applying an adjustable voltage bias to the trigger generator 10. This shifts the trigger waveform and the threshold voltage $v_{thresh}$ and, thus in effect, shifts the sampling point on the DUT waveform.

Figure 3:
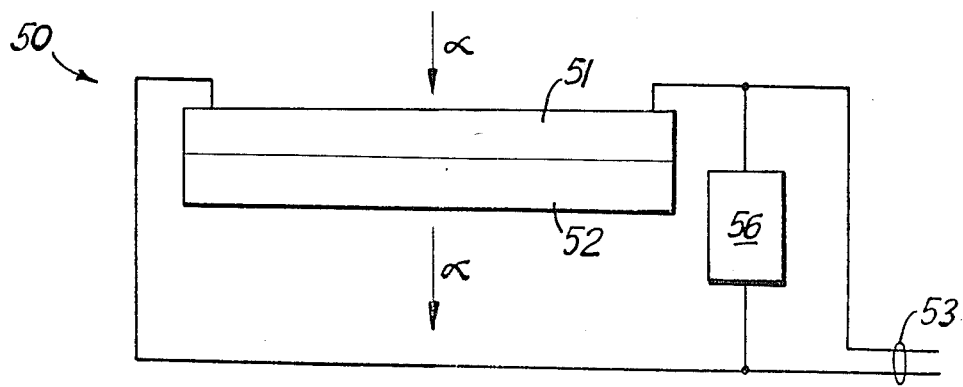
FIG. 3 is a schematic representation of an alternative trigger generator for use with the apparatus of FIG. 1.

Many other arrangements may be used in accordance with the invention in place of the trigger generator 10 shown in FIG. 1. FIG. 3 illustrates another trigger generator 50 which comprises a superconducting thin film strip 51, which may be made of niobium, on a support layer 52. The two ends of the strip 51 are connected to the trigger input terminals of the sampler (not shown in FIG. 3) via high performance transmission lines 53. The transmission lines 53 may be of superconducting material or any other material having very low loss characteristics in accordance with the particular sampler interface utilized. A biasing circuit 56 is connected across the two ends of the strip 51, or the transmission lines 53, in parallel with the trigger input terminals of the sampler.

In opertion, with no particle present, the superconducting strip 51 has zero resistance. The voltage seen at the trigger input terminals of the sampler is therefore very close to zero, depending on the resistance of the transmission lines 53. When an injected alpha particle strikes the superconducting strip 51, it reduces the order parameter of the strip 51 in a small region to the point that it is no longer superconducting. The strip 51 therefore temporarily has a finite non-zero resistance and delivers a voltage pulse to the trigger input terminals of the sampler. The alpha particle then continues through the support layer 52 and toward the DUT (not shown in FIG. 3). It will be appreciated that the superconducting layer 51 and the support layer 52 should be as thin as possible in order to affect the path and energy of the alpha particle as little as possible. The sampling of the resultant DUT waveform is performed in a manner similar to that previously described except that the trigger waveform presents a voltage pulse instead of a voltage dip. Note that any noise that may arise from the biasing circuit 56 must be isolated or reduced so as not to cause any jitter.

It is to be understood that the embodiments described herein are merely illustrative of the principles of the invention. Various modifications may be made thereto by persons skilled in the art without departing from the scope or spirit of the invention. For example, the height varying means 12 may be any one of several types of mechanisms for adjustably controlling the height $h_i$ of the trigger generator above the DUT, such as differential screws and/or a piezoelectric element. Additionally, other means may be found to vary the period between the time the trigger generator detects the incidence of a particle and the time the particle strikes the DUT. Further, although the invention embodiment is described within the context of a controlled test environment, it is clear that the invention can be used during the actual application of the electronic device to measure waveforms generated by uncontrolled particle bombardment. These and other modifications apparent to a person of ordinary skill are all within the scope of the invention.

What is claimed is:

1. Apparatus for measuring the electrical waveform generated by an atomic or subatomic particle incident on an electronic device, comprising:
    means for detecting the approach of the particle directed to strike the device a predetermined distance before the device;
    means for sampling a point on the said waveform after a time interval following detection of the approach of the particle by the means for detecting; and
    means for moving the sampling point timewise along the said waveform during succeeding particle incidences so that the means for sampling measures the entirety of the said waveform.

2. Apparatus according to claim 1, wherein the means for moving the sampling point comprises means for varying the time of the occurrence of the said waveform during succeeding particle incidences.

3. Apparatus according to claim 1, wherein the means for moving the sampling point comprises means for varying the time of the occurrence of the said waveform during succeeding particle incidences by varying the said determined distance before the device.

4. Apparatus according to claim 1, wherein the means for moving the sampling point comprises means for varying the time of sampling a point on the said waveform by the means for sampling during succeeding particle incidences.

5. Apparatus according to claim 1, wherein the means for moving the sampling point comprises means for varying the time of sampling a point on the said waveform by the means for sampling during succeeding particle incidences by varying the time interval following detection of the approach of the particle while sampling a point on the said waveform.

6. Apparatus for measuring the electrical waveform generated by an atomic or subatomic particle incident on an electronic device, comprising:
    a layer of insulating material having a region of sufficient thinness so as to allow passage of the particle therethrough to the device without substantial effect on the path or energy of the particle;
    a first layer of conductive material disposed on one face of the insulating layer and having a first means for providing passage therethrough of the particle which is aligned with the thin region of the insulating layer and the device;
    a second layer of conductive material disposed on the other face of the insulating layer and having a second means for providing passage therethrough of the particle which is aligned with the first means for providing passage, the thin region of the insulating layer and the device, said second conductive layer being a predetermined distance from the device;
    means for applying a voltage bias across the first conductive layer and the second conductive layer so that passage of the particle through the first means for providing passage, the thin region and the second means for providing passage changes the voltage across the first conductive layer and the second conductive layer so as to indicate the approach of the particle directed to strike the device a predetermined distance before the device;
    means for sampling a point on the said waveform after a time interval following detection of the approach of the particle; and
    means for moving the sampling point timewise along the said waveform during succeeding particle incidences so that the means for sampling measures the entirety of the said waveform.

7. Apparatus according to claim 6, wherein the means for moving the sampling point comprises means for varying the time of the occurrence of the said waveform during succeeding particle incidences.

8. Apparatus according to claim 6, wherein the means for moving the sampling point comprises means for varying the time of the occurrence of the said waveform during succeeding particle incidences by varying the distance between the second conductive layer and the device.

9. Apparatus according to claim 6, wherein the means for moving the sampling point comprises means for varying the time of sampling a point on the said waveform by the means for sampling during succeeding particle incidences.

10. Apparatus according to claim 6, wherein the means for moving the sampling point comprises means for varying the time of sampling a point on the said waveform by the means for sampling during succeeding particle incidences by varying the time interval following detection of the approach of the particle via the voltage change between the first conductive layer and the second conductive layer while sampling a point on the said waveform.

11. Apparatus according to claim 6, wherein the means for moving the sampling point comprises means for varying the time of sampling a point on the said waveform by the means for sampling during succeeding particle incidences by applying an adjustable voltage bias across the first conductive layer and the second conductive layer so that the voltage change caused by the particle passage can be variably changed during succeeding particle incidences.

12. Apparatus for measuring the electrical waveform generated by an atomic or subatomic particle incident on an electronic device, comprising:
   a strip of superconducting material having a a depth of sufficient thinness so as to allow passage of the particle therethrough to the device without substantial effect on the path or energy of the particle, said strip being a predetermined distance from the device;
   means for introducing a current into the strip of superconducting material so that passage of the particle through the strip changes the voltage across the depth of the strip so as to indicate the approach of the particle directed to strike the device a a predetermined distance before the device;
   means for sampling a point on the said waveform after a time interval following detection of the approach of the particle;
   means for moving the sampling point timewise along the said waveform during succeeding particle incidences so that the means for sampling measures the entirety of the said waveform.

13. Apparatus according to claim 12, wherein the means for moving the sampling point comprises means for varying the time of the occurrence of the said waveform during succeeding particle incidences.

14. Apparatus according to claim 12, wherein the means for moving the sampling point comprises means for varying the time of the occurrence of the said waveform during succeeding particle incidences by varying the distance between the strip of superconducting material and the device.

15. Apparatus according to claim 12, wherein the means for moving the sampling point comprises means for varying the time of sampling of a point on the said waveform by the means for sampling during succeeding particle incidences.

16. Apparatus according to claim 12, wherein the means for moving the sampling point comprises means for varying the time of sampling of a point on the said waveform by the means for sampling during succeeding particle incidences by varying the first time interval following detection of the approach of the particle by the voltage change across the depth of the strip while sampling a point on the said waveform.

17. Apparatus according to claim 12, wherein the means for moving the sampling point comprises means for varying the time of sampling of a point on the said waveform by the means for sampling during succeeding particle incidences by applying an adjustable voltage bias across the depth of the strip so that the voltage change caused by the particle passage can be variably changed during succeeding particle incidences.

18. A method for measuring the electrical waveform generated when a particle strikes an electronic device, comprising the steps of:
   (a) detecting the approach of the particle directed to strike the device at a predetermined distance before the device;
   (b) sampling a point on the generated waveform after a time interval following step (a) so as to obtain a measurement of a discrete point on the waveform;
   (c) moving the sampling point timewise along the generated waveform; and
   (d) repeating the steps (a) through (c) during succeeding particle incidences until enough discrete points are measured to yield a curve characterizing the generated waveform having a desired level of continuity.

19. The method according to claim 18, further comprising prior to step (c) the steps of:
   (e) repeating steps (a) and (b) a desired number of times during succeeding particle incidences; and
   (f) averaging the measurements for each discrete point obtained during repetitions of step (b).

* * * * *

UNITED STATES PATENT AND TRADEMARK OFFICE
CERTIFICATE OF CORRECTION

PATENT NO. : 4,777,362

DATED : October 11, 1988

INVENTOR(S) : Sadeg M. Faris

It is certified that error appears in the above-identified patent and that said Letters Patent is hereby corrected as shown below:

Column 3, line 9, "accomodate" should read --accommodate--.

Column 5, line 68, "the said determined" should read --said predetermined--.

Column 7, line 18, "a a depth" should read --a depth--.

Column 7, line 29, "a a prede-" should read --a prede- --.

Column 8, line 12, "the first time" should read --the time--.

Signed and Sealed this

Third Day of July, 1990

*Attest:*

HARRY F. MANBECK, JR.

*Attesting Officer*  *Commissioner of Patents and Trademarks*